(12) United States Patent
Timmons et al.

(10) Patent No.: US 10,353,045 B2
(45) Date of Patent: Jul. 16, 2019

(54) METHODS AND DEVICES FOR HIGH STABILITY PRECISION VOLTAGE DIVIDERS

(71) Applicant: Guildline Instruments Ltd., Smiths Falls (CA)

(72) Inventors: Richard Timmons, Ottawa (CA); Andre Perras, McDonalds Corners (CA); Mark Evans, Kingston (CA); Tomasz Barczyk, Ottawa (CA)

(73) Assignee: Guildline Intsruments Ltd., Smiths Falls (CA)

( * ) Notice: Subject to any disclaimer, the term of this patent is extended or adjusted under 35 U.S.C. 154(b) by 24 days.

(21) Appl. No.: 15/458,241

(22) Filed: Mar. 14, 2017

(65) Prior Publication Data

US 2017/0307718 A1   Oct. 26, 2017

Related U.S. Application Data

(60) Provisional application No. 62/326,293, filed on Apr. 22, 2016.

(51) Int. Cl.
*G01R 15/04* (2006.01)
*G01R 35/00* (2006.01)

(52) U.S. Cl.
CPC .......... *G01R 35/007* (2013.01); *G01R 15/04* (2013.01); *G01R 35/005* (2013.01)

(58) Field of Classification Search
CPC ..... G01R 35/007; G01R 35/005; G01R 15/04
See application file for complete search history.

(56) References Cited

PUBLICATIONS

Hewlett-Packard Journal, A Combined DC Voltage Standard and Differential Voltmeter for Precise Calibration Work, May 1965, Technical Information from the HP Laboratories, vol. 16, No. 9, pp. 1-8.*

* cited by examiner

*Primary Examiner* — Toan M Le
(74) *Attorney, Agent, or Firm* — Akerman LLP

(57) ABSTRACT

Resistor voltage dividers are commonly used to create reference voltages, or to reduce the magnitude of a voltage so it can be measured. Many measurements in test and measurement or calibration applications regularly require accuracies within the sub-part per million (ppm) range, e.g. 0.1 ppm to 1.0 ppm. However, the continued drive for improved accuracy in calibration, standards, and measurements on circuits and components means many measurements and measurement systems are operating at 50 parts per billion (ppb) and below to approximately 10 ppb. At these levels even relatively simple passive elements such as voltage dividers cannot be used without calibration and that these calibrations may be required at frequencies substantially higher than the other elements within the test and measurement equipment. Accordingly, the inventors have established a self-contained voltage divider with internal calibration allowing the voltage divider to be calibrated for every measurement if necessary.

19 Claims, 11 Drawing Sheets

R1=108R
R2=18R
R3=3R
R4=R
R5=15R
R6=90R

METHODS AND DEVICES FOR HIGH STABILITY PRECISION VOLTAGE DIVIDERS

CROSS-REFERENCE TO RELATED APPLICATIONS

This patent application claims the benefit of U.S. Patent Application 62/326,293 filed Apr. 22, 2016 entitled "Methods and Devices for High Stability Precision Voltage Dividers."

FIELD OF THE INVENTION

This invention relates generally to voltage dividers and more particularly to high stability precision voltage dividers for use within electrical measurement and calibration systems.

BACKGROUND OF THE INVENTION

Alternating Current (AC) and Direct Current (DC) electrical measurements are used in a wide variety of applications and may be performed for a variety of electrical quantities including voltage, current, capacitance, impedance, resistance etc. These tests and measurements include those relating to designing, evaluating, maintaining, calibrating and servicing electrical circuits and equipment from high voltage electrical transmission lines operating at different currents and voltages for a wide range of applications including those within industrial, scientific, military, medical and consumer fields for a wide variety of electrical and electronic devices directly or systems indirectly requiring precision electronic and electrical control. Accordingly, a wide range of electrical test and measurement systems are employed in the design, evaluation, maintenance, servicing and calibration of such electronic and electrical control circuits, systems and devices.

Within such test and measurement equipment (TME) a voltage divider (also known as a potential divider) may be employed. In essence a voltage divider is a passive linear circuit that produces an output voltage that is a predetermined fraction of its input voltage. Such predetermined fractions may be 10% (10:1), 1% (100:1), 0.1% (1000:1) and generally achieve this by distributing the input voltage among the components of the voltage divider. In addition to the different fractions (divider ratios) then different circuits may be employed for different voltages (e.g. 100V, 1 kV, 10 kV) or different powers.

Resistor voltage dividers are commonly used to create reference voltages, or to reduce the magnitude of a voltage so it can be measured, and may also be used as signal attenuators at low frequencies. For direct current and relatively low frequencies, a voltage divider may be sufficiently accurate if made only of resistors; where frequency response over a wide range is required (such as in an oscilloscope probe), a voltage divider may have capacitive elements added to compensate load capacitance. In electric power transmission, a capacitive voltage divider is used for measurement of high voltage.

Many measurements in these applications regularly require accuracies within the sub-part per million (ppm) range, e.g. 0.1 ppm to 1.0 ppm. However, the continued drive for improved accuracy in calibration, standards, and measurements on circuits and components means many measurements and measurement systems are operating at 50 parts per billion (ppb) and below to approximately 10 ppb. At these levels the inventors have identified that even relatively simple passive elements such as voltage dividers cannot be used without calibration and that these calibrations may be required at frequencies substantially higher than the other elements within the TME. Accordingly, the inventors have established a self-contained voltage divider with internal calibration allowing the voltage divider to be calibrated for every measurement if necessary.

Other aspects and features of the present invention will become apparent to those ordinarily skilled in the art upon review of the following description of specific embodiments of the invention in conjunction with the accompanying figures.

SUMMARY OF THE INVENTION

It is an object of the present invention to mitigate limitations within the prior art relating to electrical measurement and calibration systems and more particularly to current comparator based measurement and calibration systems with parts per billion accuracy.

In accordance with an embodiment of the invention there is provided a device comprising:
a microprocessor;
an input port;
an input selector coupled to the input port for selecting a voltage divider of a plurality of voltage dividers;
an output selector coupled to the plurality of voltage dividers for coupling the selected voltage divider of the plurality of voltage dividers to an output port;
a switching circuit disposed between the output selector and the plurality of voltage dividers selectively coupling for either connecting the selected voltage divider of the plurality of voltage dividers to the output selector or a calibration bridge;
the calibration bridge coupled to the switching circuit and a voltage reference source and providing first and second signals to a null detector circuit; and
the null detector circuit; wherein
in a first configuration an electrical signal at the input port is coupled to the output port via the selected voltage divider of the plurality of voltage dividers; and
in a second configuration the selected voltage divider of the plurality of voltage dividers is automatically calibrated by a calibration routine in execution upon the microprocessor and the selected voltage divider of the plurality of voltage dividers is coupled to the calibration bridge.

In accordance with an embodiment of the invention there is provided a device comprising:
a microprocessor;
an input port;
a plurality of slots, each slot for receiving a voltage divider circuit;
an input selector coupled to the input port for selectively coupling an electrical signal received at the input port to a selected slot of the plurality of slots;
an output selector switch coupled to the plurality of slots for coupling a selected slot of the plurality of slots to an output port;
a switching circuit comprising:
a first portion disposed between the output selector and the plurality of slots for selectively coupling the selected slot to the output selector or a calibration bridge; and
a second portion coupled to the plurality of slots for selectively coupling the selected slot to the calibration bridge;

the calibration bridge for providing first and second signals to a null detector circuit; and the null detector circuit; wherein in a first configuration an electrical signal at the input port is coupled to the output port via a selected voltage divider installed within a slot of the plurality of slots; and in a second configuration a selected voltage divider installed within the slot of the plurality of slots is automatically calibrated by a calibration routine in execution upon the microprocessor wherein a reference voltage generated by the installed voltage divider is coupled to the calibration bridge via the second portion of the switching circuit.

In accordance with an embodiment of the invention there is provided a device comprising:

a port for receiving an electrical signal from a connector coupled to the port and coupling it to a voltage divider circuit;

the voltage divider circuit for dividing the received electrical signal and coupling it to a first output port of the voltage divider;

a reference voltage source; and a second output port coupled to the reference voltage sense.

In accordance with an embodiment of the invention there is provided a device comprising:

a resistive divider network comprising at least one stage of a plurality of stages disposed between an input port and a ground rail;

each stage having an output port having a voltage equal to an applied voltage at the input port divided by a predetermined ratio established in dependence upon the resistances of each stage; and each output port apart from the one adjacent to the ground rail is coupled to the ground rail by a resistor.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

The present invention is directed to voltage dividers and more particularly to high stability precision voltage dividers for use within electrical measurement and calibration systems.

The ensuing description provides exemplary embodiment(s) only, and is not intended to limit the scope, applicability or configuration of the disclosure. Rather, the ensuing description of the exemplary embodiment(s) will provide those skilled in the art with an enabling description for implementing an exemplary embodiment. It being understood that various changes may be made in the function and arrangement of elements without departing from the spirit and scope as set forth in the appended claims.

Figure 1:
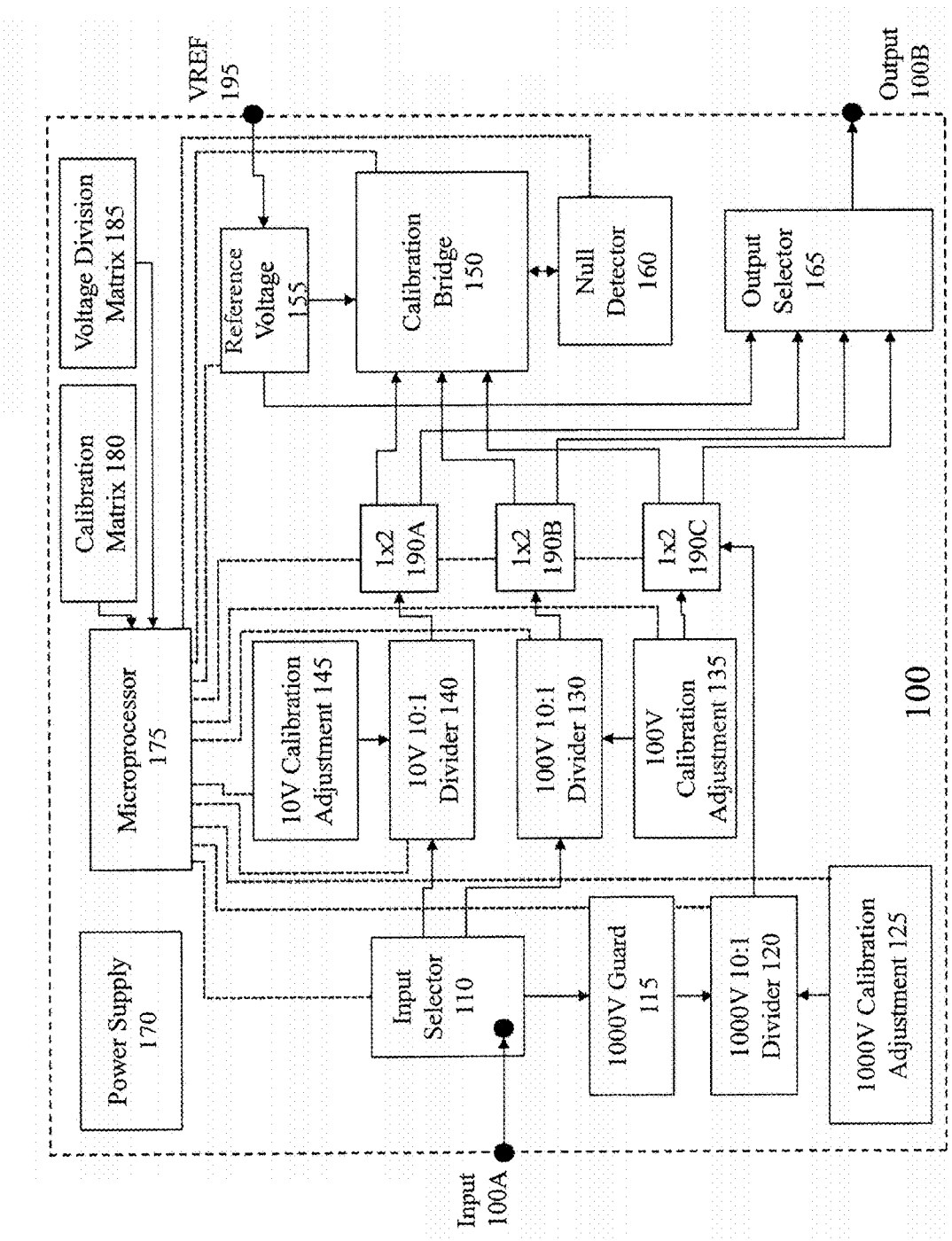
FIG. 1 depicts a schematic of a self-calibrating multiple range voltage divider according to an embodiment of the invention.

Referring to FIG. 1 there is depicted a schematic of a self-calibrating multiple range voltage divider (SC-MRVD) 100 according to an embodiment of the invention. Accordingly, an input 100A provides an electrical signal to be divided to an input selector 110 which is coupled to a microprocessor (μP) 175 for control signal provisioning. Based upon the μP 175 signal the received input electrical signal is coupled to either a first Divider 140, a 10V 10:1 divider; second Divider 130, a 100V 10:1 divider; and third Divider 120, a 1000V (1 kv) 10:1 divider. In some instances, e.g. third Divider 120, the divider may be coupled to the input via a protection and/or isolating circuit such as depicted with 1000V Guard 115 The outputs of the first to third Dividers 120 to 140 respectively are coupled to first to third switches 190A to 190C respectively that route the divided voltage from the respective divider to either the Calibration Bridge 150 or the Output Selector 165. The Output Selector 165 and first to third switches 190A to 190C respectively are also connected to the μP 175 allowing the configuration of the SC-MRVD 100 to be established. For operation as a divider during a measurement the SC-MRVD 100 is configured by the μP 175 such that the input 100A is coupled to and from the appropriate divider and therein to the output 100B.

Each of the first to third Dividers 120 to 140 respectively are in addition to being coupled to the Input Selector 110 and first to third switches 190A to 190C respectively are also coupled to a respective calibration adjustment circuit. With SC-MRVD 100 these are 10V Calibration Adjustment 145 coupled to the first Divider 140, 100V Calibration Adjustment 135 coupled to the second Divider 130, and 1000V Calibration Adjustment 125 coupled to third Divider 120. These calibration adjustment circuits are also connected to μP 175. A Reference Voltage circuit 155 is coupled to Calibration Bridge 150 and the Output Selector 165 whilst the Calibration Bridge is also connected to a Null Detector 160 which it itself coupled to the μP 175. Accordingly, the μP 175 can establish a calibration mode for one of the first to third Dividers 120 to 140 wherein the selected divider is coupled to the Calibration Bridge 150 via its associated switch of first to third switches 190A to 190C and its associated calibration adjustment circuit enabled.

Accordingly, in a calibration mode a known probe voltage is applied from the calibration adjustment circuit to its associated divider circuit and therein to the Calibration Bridge 150 which receives the Reference Voltage 155. The Calibration Bridge 150 providing signals to the Null Detector 160 and the output from the Null Detector 160 is read by the μP 175. Based upon the output from the Null Detector 160 the μP 175 may adjust the calibration of the divider circuit via the calibration adjustment circuit. Data relating to the calibration adjustments and voltage division circuits may be stored within matrices accessible by the μP 175, depicted as Calibration Matrix 180 and Voltage Division Matrix 185. These matrices may, for example, in addition to current calibration parameters store additional calibration characteristic information relating to aspects of the SC-MRVD 100 operation such as temperature, DC vs AC performance, input current, pressure, etc.

Accordingly, the SC-MRVD 100 when integrated into a TME system may perform a calibration routine automatically prior to any measurement with the TME system. Alternatively, the SC-MRVD 100 may exploit time dependent data within the matrices, Calibration Matrix 180 and Voltage Division Matrix 185, such that a series of measurements with a TME system with a single calibration of the associated divider may be performed. This calibration "frequency" may also be established, for example, based upon an indication of measurement accuracy during a configuration of the SC-VR-MD 100A within the TME. For example, to provide voltage divider accuracy at 20 ppb a calibration every measurement may be required whereas 50 ppb accuracy may allow multiple measurements within a 15-minute period provided ambient environmental conditions do not change outside predetermined limits, and 0.1 ppm (100 ppb) accuracy may allow measurements over a 2 hour period provided instrument stability for over an hour may be sufficient for measurements at provided ambient environmental conditions do not change outside a different set of predetermined limits.

The SC-MRVD 100 may also be configured to couple the internal voltage reference from Reference Voltage 155 to the output 100B or receive an external reference voltage at a port VREF 195. This port, may for example, be employed with an internal reference source, e.g. a temperate stabilized Zener diode, is insufficient at very low ppb accuracies thereby allowing an external voltage reference, e.g. a Josephson junction voltage reference. A power supply 170 is depicted which provides the stable power supplies for the different components within the SC-MRVD 100. Other elements that may be provided within the SC-MRVD 100 within different products offered exploiting the self-contained self-calibrating voltage divider concepts according to embodiments of the invention may include one or more communications interfaces to an external TME, front-panel touch panel configuration, front-panel display for configuration—status—measurement display, shielded and/or unshielded electrical connectors for input—output—VREF etc. As such elements do not impact the underlying self-contained self-calibrating voltage divider concept these have not been depicted within the schematic for the SC-MRVD 100.

It would be evident that the resulting SC-MRVD 100 is a self-contained self-calibrating voltage divider wherein the underlying accuracy of calibration is now determined by the accuracy of the null detector circuit. Accordingly, within another embodiment of the invention at the highest accuracies, e.g. few 10 s of ppb, an external null circuit may be employed or an alternate null circuit design for a high accuracy SC-MRVD 100.

Figure 2:
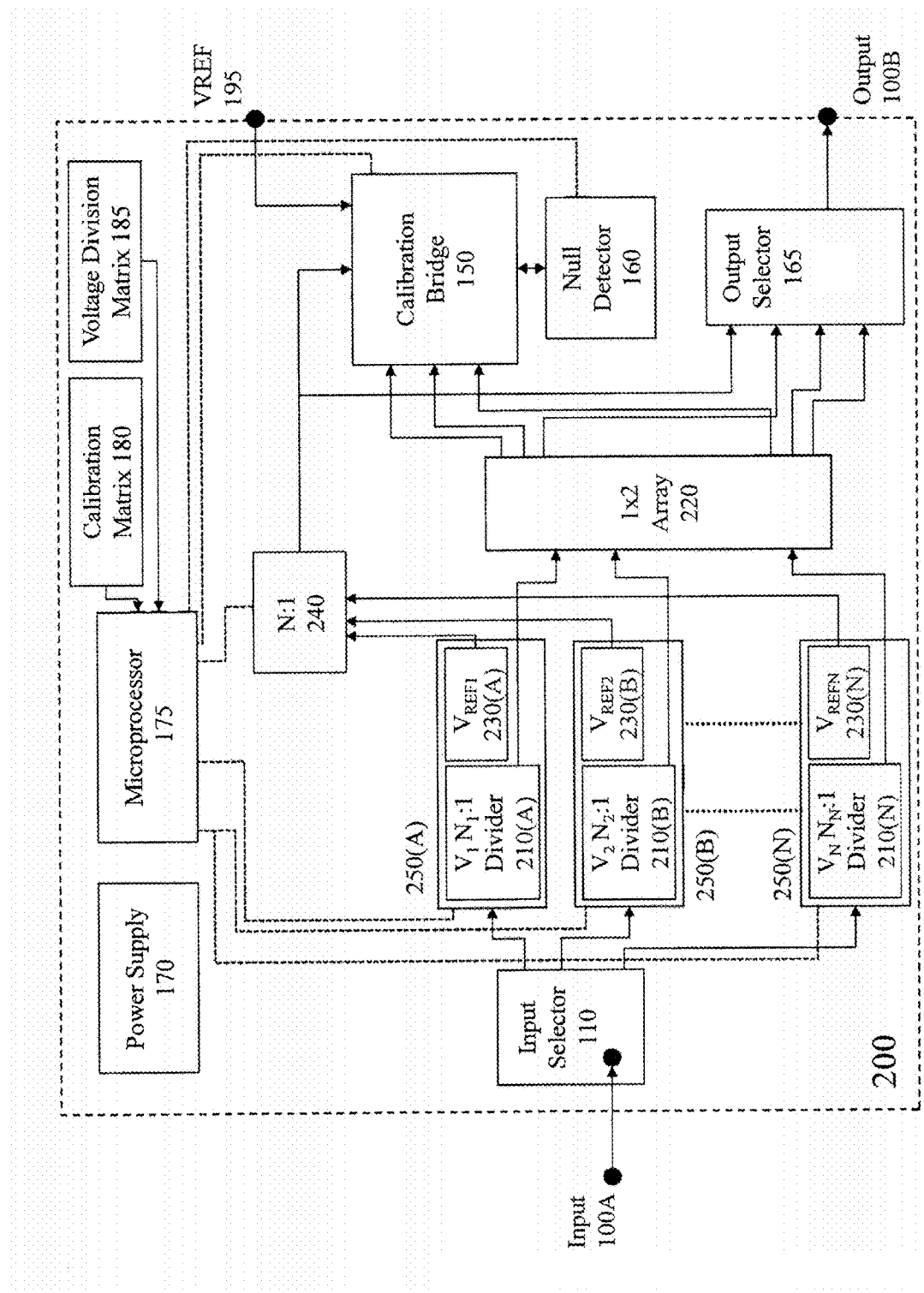
FIG. 2 depicts a schematic of a self-calibrating multiple range voltage divider according to an embodiment of the invention.

Now referring to FIG. 2 there is depicted a schematic for a self-calibrating module voltage divider (SC-MVD) 200. Accordingly, as depicted multiple divider reference modules 250(A) to 250(N) may be inserted within the chassis of the SC-MVD 200. Each divider reference modules 250(A) to 250(N) comprising a respective voltage divider 210(A) to 210(N) and voltage reference source 230(A) to 230(N). Each voltage divider 210(A) to 210(N) comprising a voltage divider circuit and its associated calibration adjustment circuit. For example, if voltage divider 210(A) were a 100V 10:1 divider it would comprise 100V 10:1 Divider 130 as depicted in FIG. 1 and 100V Calibration Adjustment 135 as depicted in FIG. 135. The associated voltage reference source 230(A) may for example be Reference Voltage 155 in FIG. 1. In this manner each divider reference modules 250(A) to 250(N) is self-contained.

Accordingly, under the control of the μP 175 the output of a divider reference module is coupled either to the Output 100B via the Output Selector 165 and 1×2 Array 220 or coupled to the Calibration Bridge 150 via the 1×2 Array 220. In the calibration mode with the divider reference modules 250(A) to 250(N) coupled to the Calibration Bridge 150 the voltage reference within the divider reference modules 250 (A) to 250(N) is also coupled to the Calibration Bridge 150 via N:1 switch 240. As depicted in FIG. 2 the remaining elements of the SC-MVD 200 correspond to those discussed supra in respect of the SC-MRVD 100 in FIG. 1. Accordingly, the μP 175 is coupled to matrices such as Calibration Matrix 180 and Voltage Division Matrix 185 whilst the Calibration Bridge 150 is connected to Null Detector 160 and may accept an external reference voltage via VREF 195. Further the input 100A is coupled to Input Selector 110. It would be evident that within other embodiments of the invention the Null Detector 160 and/or Calibration Bridge 150 may be modular allowing the SC-MVD 200 to operate at different accuracies according to the module employed. Further, multiple detection modules each with Null Detector 160 and Calibration Bridge 150 may be employed with multiple inputs simultaneously if the N:1 switch is replaced with an N×M switch (N divider reference modules and M detection modules) and N×(M+1) switch replacing the 1×2 array 220.

Whilst the Calibration Bridge 150 is depicted in FIGS. 1 and 2 as being coupled via the 1×2 switches to each divider it would be evident that a N×1 switch may alternatively be employed as a selector circuit disposed between the Calibration Bridge 150 and the multiple divider circuits.

Optionally SC-MRVD 100 in FIG. 1 may have additional ports/interfaces on the Input Selector 110, 1×2 switches, Calibration Bridge 150 or intervening selector circuit etc. such that it may be expanded further from an initially purchased configuration.

Optionally, either SC-MRVD 100 in FIG. 1 and/or SC-MVD 200 in FIG. 2 may exploit multiple Calibration Bridges 150 such that each Calibration Bridge 150 is specifically designed/optimized for its associated voltage divider.

Optionally, each divider reference module may include a 1×2 switch acting as a mode selector switch such that the output of the voltage divider reference is either coupled to the Output Selector 165 or the Calibration Bridge 150.

Each of the self-calibrating multiple range voltage dividers depicted in FIGS. 1 and 2, namely SC-MRVD 100 and SC-MRVD 200 respectively exploit multiple voltage dividers. Within SC-MRVD 100 these are a first Divider 140 (10V 10:1 divider), second Divider 130 (100V 10:1 divider), and third Divider 120 (1 kV 10:1 divider) each coupled to a calibration adjustment circuit, being 10V Calibration Adjustment 145, 100V Calibration Adjustment 135, and 1 kV Calibration Adjustment 125. Within SC-MRVD 200 these are divider reference modules 250(A) to 250(N) having different ratios, $N_1:1$ to $N_N:1$ respectively, each having an associated voltage reference circuit, being voltage reference sources 230(A) to 230(N) respectively.

Figure 3:
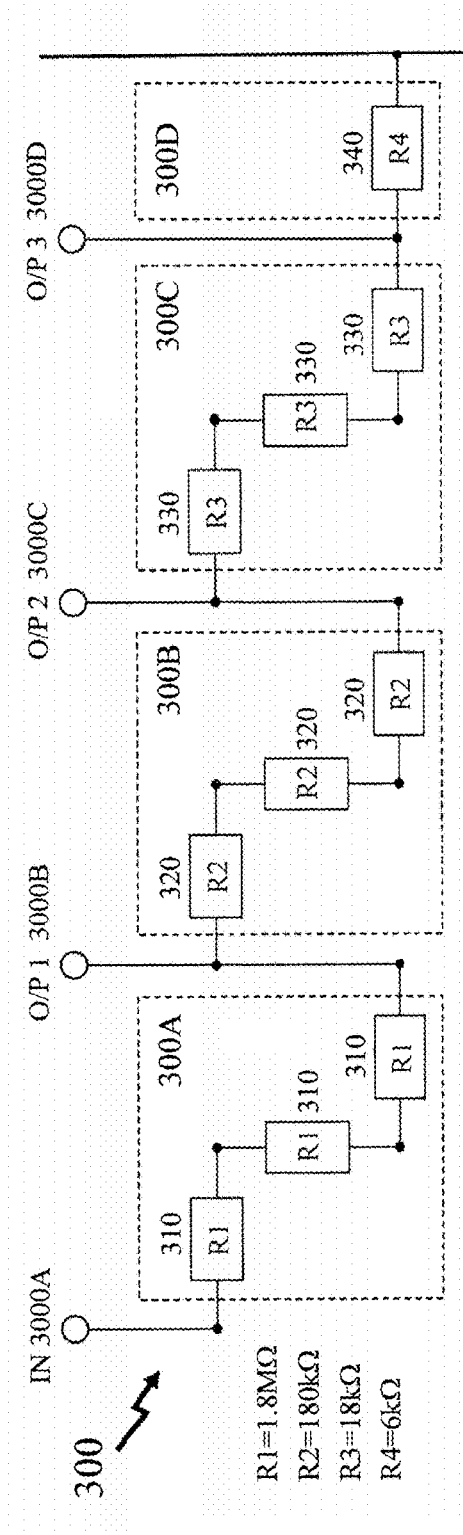
FIG. 3 depicts a multiple range (multi-range) voltage divider circuit according to the prior art.

Alternatively, as depicted in FIG. 3 these multiple discrete voltage dividers may be implemented as a multiple range voltage divider circuit (MRVDC) 300 according to the prior art. Such a prior art MRVDC 300 may be implemented using first to fourth resistor networks 300A to 300D respectively disposed between the input 3000A, IN, and ground. Disposed between each pair of the first to fourth resistor networks 300A to 300D respectively are first to third output taps O/P 1 3000B, O/P 2 3000C, and O/P 3 3000D respectively.

First to fourth resistor networks 300A to 300D respectively comprise:
First resistor network 300A formed from three first resistors R1 310 in series;
Second resistor network 300B formed from three second resistors R2 320 in series;
Third resistor network 300C formed from three third resistors R3 330 in series;
Fourth resistor network 300D comprising single fourth resistor R4 340.

If R1=300R, R2=30R, R3=3R, and R4=R then O/P 1 3000B is 1:10 divided relative to the input voltage at input (IN) 3000A, O/P 2 3000C is 1:100 divided, and O/P 3 3000D is 1:1000 divided. With, for example, R=6 kΩ the input resistance of IN 3000A is 6 MΩ. Accordingly, the multiple voltage divider 300 provides three divided outputs simultaneously relative to the input voltage divided by 10, 100, and 1000 respectively.

Figure 4A:
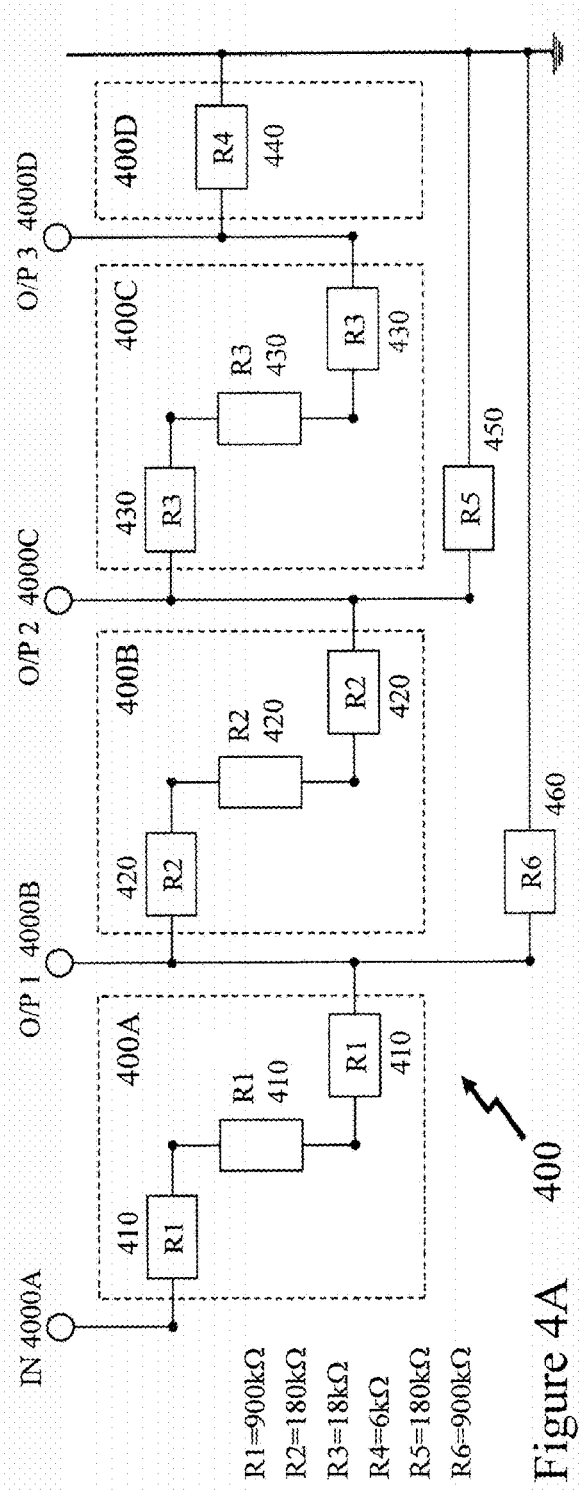
FIG. 4A depicts a multi-range voltage divider circuit according to an embodiment of the invention employing multiple resistors within each stage.

Now referring to FIG. 4A there is depicted a MRVDC 400 according to an embodiment of the invention using first to fourth resistor networks 400A to 400D respectively disposed between the input 4000A, IN, and ground. Disposed between each pair of the first to fourth resistor networks 400A to 400D respectively are first to third output taps O/P 1 4000B, O/P 2 4000C, and O/P 3 4000D respectively.

First to fourth resistor networks 400A to 400D respectively comprise:
First resistor network 400A formed from three first resistors R1 410 in series;
Second resistor network 400B formed from three second resistors R2 420 in series;
Third resistor network 400C formed from three third resistors R3 430 in series;
Fourth resistor network 400D comprising single fourth resistor R4 440.

However, in contrast to the prior art multi-range voltage divider circuit 300 the multi-range voltage divider circuit 400 now also comprises resistors disposed between the ground rail and each of the O/P 2 4000C and O/P 1 4000B points respectively. These being fifth resistor R5 450 and sixth resistor R6 460. Now with R1=150R, R2=22.5R, R3=3R, R4=R, R5=30Rm and R6=150R then O/P 1 4000B is 1:10 divided relative to the input voltage at input (IN) 3000A. Further, each of O/P 2 4000C are then by 1:10 divided, and O/P 3 4000D is 1:100 relative to O/P 1 400B and hence divided 1:100 and 1:1000 respectively relative to IN 3000A. Accordingly, the multiple voltage divider 300 provides three divided outputs simultaneously relative to the input voltage divided by 10, 100, and 1000 respectively. With R=6 kΩ the input impedance of IN 3000A is 3 MΩ.

Alternatively, other designs may be implement such as:
Variant 1: R1=1.8 MΩ, R2=270 kΩ, R3=40.5 kΩ, R4=13.5 kΩ, R5=270 kΩ, and R6=1.8 MΩ; and
Variant 2: R1=1.2 MΩ, R2=180 kΩ, R3=27 kΩ, R4=9 kΩ, R5=180 kΩ, and R6=1.2 MΩ.

Figure 4B:
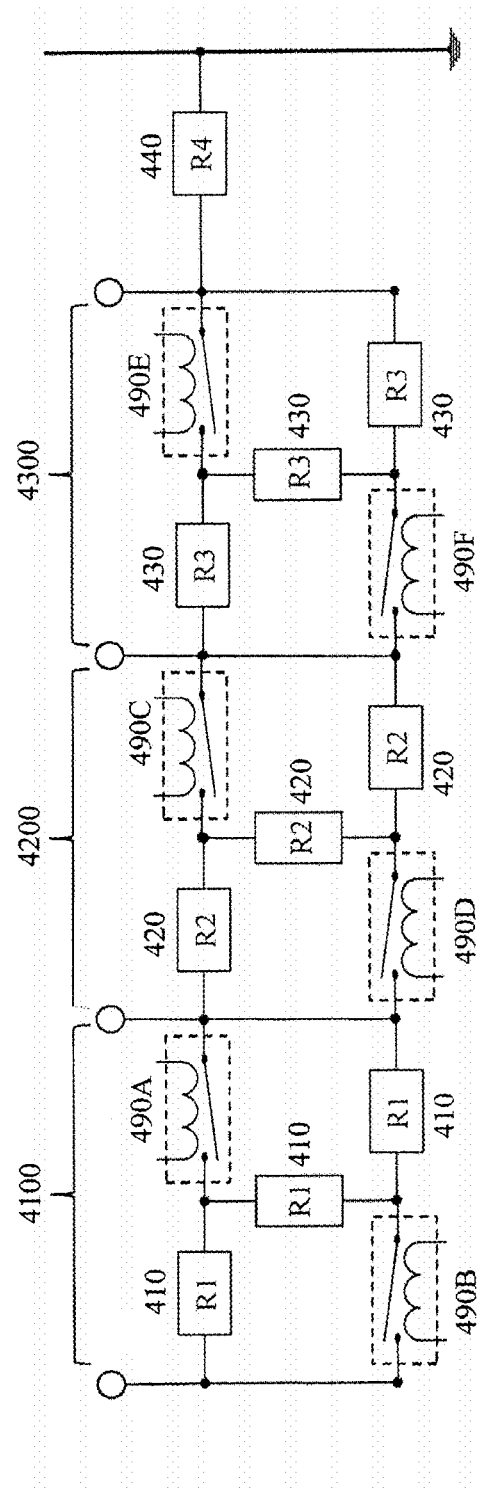
FIG. 4B depicts a multi-range voltage divider circuit according to an embodiment of the invention with relays to isolate discrete resistors of the multiple resistors within each stage.

Now referring to FIG. 4B there is depicted a MRVDC 4000 according to an embodiment of the invention with relays within each stage to isolate the discrete resistors of the multiple resistors within each stage. Accordingly, within each stage there are a pair of relays, first and second relays 490A and 490B within the first stage 4100, third and fourth relays 490C and 490D within the second stage 4200, and fifth and sixth relays 490E and 490F within the third stage 4300. Each of the relays adds a resistance when closed which should be corrected for. Accordingly, as depicted in first to third images 4000A to 4000C respectively representing first stage 4100 in three configurations, these being:

First image 4000A with first relay 490A open and second relay 490B closed such that only resistor 410C is disposed across the first stage 4100 rather than all 3 resistors 410A, 410B and 410C;
Second image 4000B with first relay 490A closed and second relay 490B open such that only resistor 410A is disposed across the first stage 4100 rather than all 3 resistors 410A, 410B and 410C; and
Third image 4000C with first relay 490A closed and second relay 490B closed such that only resistor 410B is disposed across the first stage 4100 rather than all 3 resistors 410A, 410B and 410C.

It would be evident to one of skill in the art that the tolerance of the division ratios within prior art MRVDC 300 and MRVDC 400 are dependent upon the tolerances of resistors employed. Within electrical test instruments the requirements regularly require accuracies within the sub-part per million (ppm) range, e.g. 0.1 ppm to 1.0 ppm. In comparison ultra-high precision resistors typically only offer tolerances of ±50 ppm, temperature coefficients of ±15 ppm/° C., and lifetime drift of similar levels. Accordingly, for high precision test applications to provide the required accuracy of the MRVDC 400 and allow for balancing of the calibration bridge and/or a measurement bridge, compensating for ageing, correcting for relay resistances (c.f. FIG. 4B) and some compensation of tolerances the inventors add adjustment circuits such as depicted in adjustment circuits 500 and 600 respectively in FIGS. 5 and 6 respectively. The design steps of the establishment of the resistor values within the adjustment circuits are based upon establishing an initial instrument condition wherein at start of life the potentiometers are set to the middle of their resistance range and the desired range of adjustment in ppm and resistance, for example. Other design criteria may be established within other implementations and embodiments of the invention.

Figure 4B:
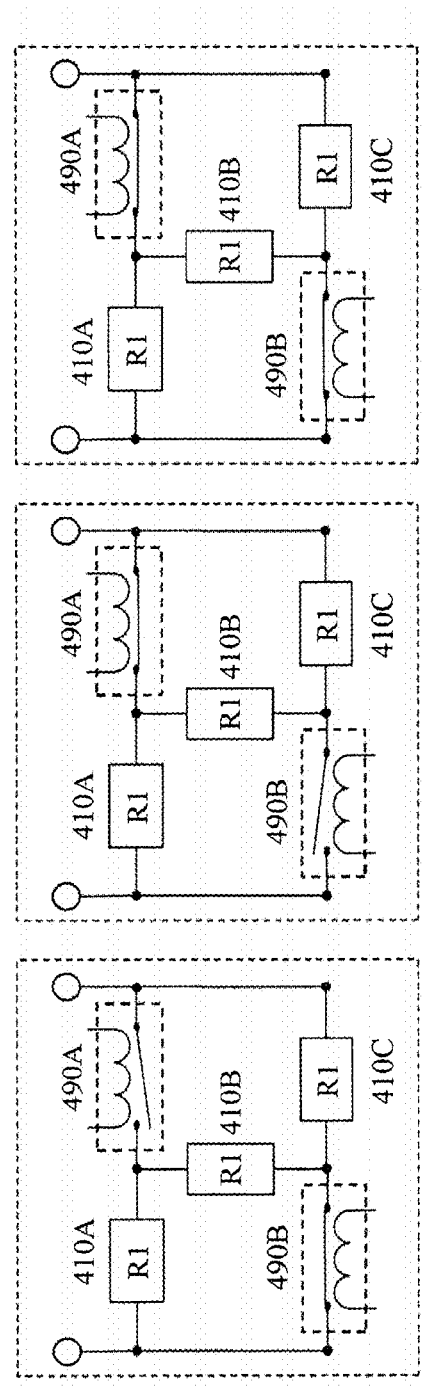
Figures 5, 6:
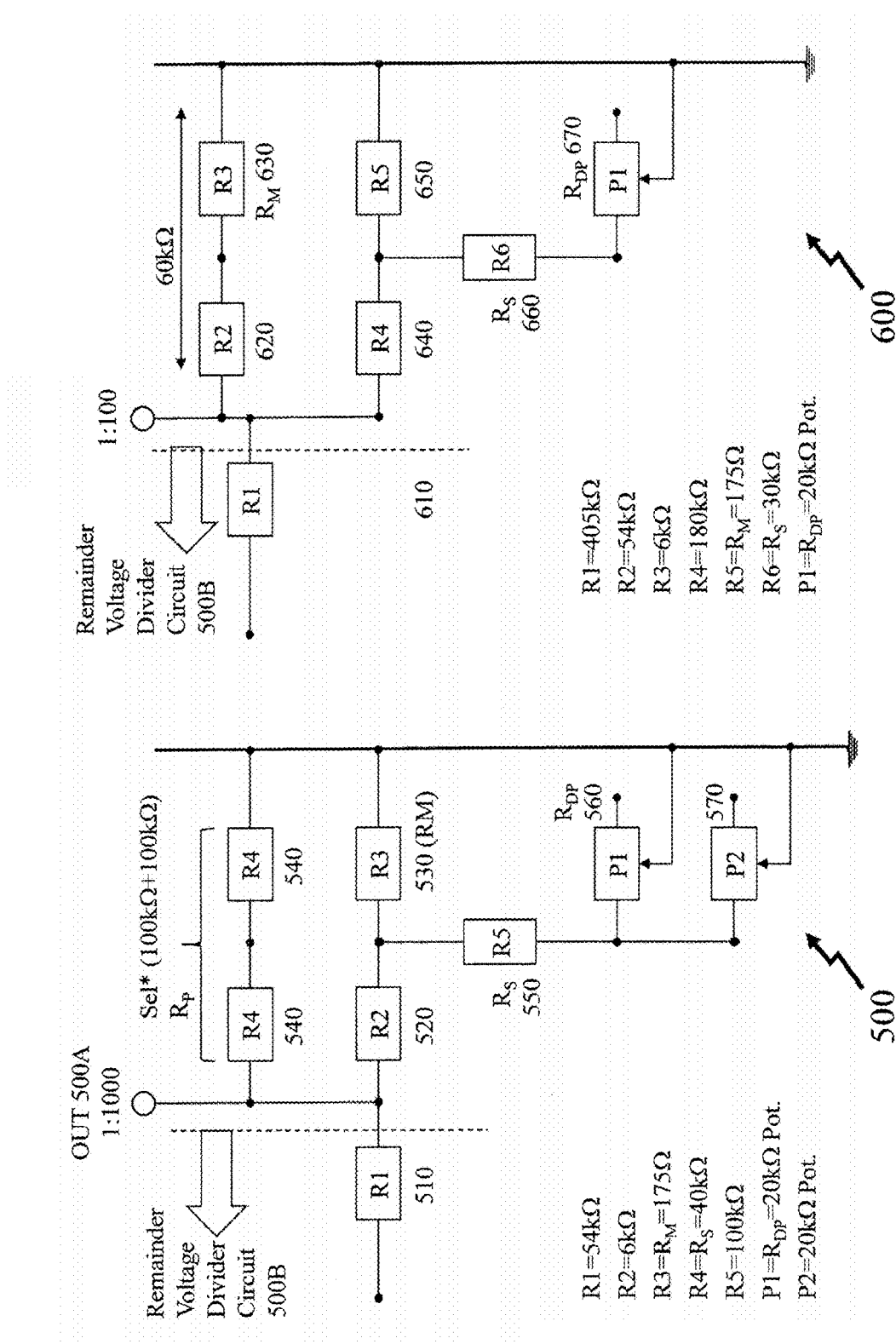
FIG. 5 depicts an adjustment circuit for a 1:1000 divider forming part of a multi-range) voltage divider circuit according to an embodiment of the invention.
FIG. 6 depicts an adjustment circuit for a 1:100 divider forming part of a multi-range) voltage divider circuit according to an embodiment of the invention.

Accordingly, referring to FIG. 5 there is depicted an adjustment circuit 500 for a 1:1000 divider forming part of a MRVDC according to an embodiment of the invention such as MRVDC 400 in FIG. 4. Accordingly, an output port 500A of the circuit is depicted between ground and the remainder of the MRVDC, denoted as MRVDC section 500B including first resistor R1 510. As depicted rather than a single resistor to ground, such as depicted within the MRVDC 400, port 500A is coupled to ground via an adjustment circuit comprising second and third resistors R2 520 and R3 530 (RM) together with a pair of fourth resistors R4 540 ($R_P$, Sel*). The adjustment circuit also comprises a fifth resistor R5 550 ($R_S$) and first and second potentiometers P1 560 ($R_{DP}$) and P2 570, which may be electronic potentiometers (E-Pot) within an embodiment of the invention to allow automated adjustment of the first and second potentiometers P1 560 and P2 570 within an electronic test instrument such as SC-MRVD 100 and SC-MRVD 200 in FIGS. 1 and 2 respectively.

Within an embodiment of the invention R1=54 kΩ (equivalent to 3×R3 430 in MRVDC 400 in FIG. 4) and R2=6 kΩ (equivalent to R4 440 in MRVDC 400 in FIG. 4. Considering a target adjustment range of ≥50 ppm with balance at ≈67% ($R_S$≈15 [ppm]) and an aging allocation of ±15 ppm and $R_L$≈0.05 [ppm] then this can be achieved with R3=175Ω and $R_P$=2×R4=200 kΩ (i.e. R4=100 kΩ) together with R4=40 kΩ, P1=40 kΩ and P2=20 kΩ. Accordingly, E-Pot P1 560 gives an adjustment in 0.05 ppm steps and E-Pot P2 570 gives an adjustment in 0.002 ppm steps. Overall, the adjustment range achieves in excess of the target range.

Now referring to FIG. 6 there is depicted an adjustment circuit 600 for a 1:100 divider forming part of a MRVDC according to an embodiment of the invention. As with FIG. 5 the target adjustment range of ≥50 ppm with balance at ≈67% ($R_S$≈15 [ppm]) and an aging allocation of ±15 ppm and $R_L$≈0.05 [ppm]. However, as the divider now being adjusted in a 1:100 divider rather than a 1:1000 divider the required resistance tuning is now larger and a different adjustment circuit configuration employed. The 1:100 tap point is now in addition to be coupled to ground via R2 620 and R3 630 is coupled via R4 640 and R5 650 wherein a resistor (R6 660) and potentiometer (P1 670) are center tapped to this pair to ground. As with FIG. 5 the potentiometer may be an E-Pot.

Therefore, within an embodiment of the invention R1=405 kΩ (equivalent to 3×R2 420 in MRVDC 400 in FIG. 4) and R2=54 kΩ (equivalent to 3×R3 430 in MRVDC 400 in FIG. 4), and R3=6 kΩ (equivalent to R4 440 in MRVDC 400 in FIG. 4). Considering a target adjustment range of ≥50 ppm with balance at ≈67% ($R_S$≈15 [ppm]) and an aging allocation of ±15 ppm and $R_L$≈0.05 [ppm] then this can be achieved with R4=180 kΩ and $R_M$=R5=18 kΩ, R6=30 kΩ and P1=$R_{DP}$=20 kΩ. Accordingly, E-Pot P1 670 gives an adjustment in 0.05 ppm steps. Overall, the adjustment range achieves in excess of the target range.

Figure 7:
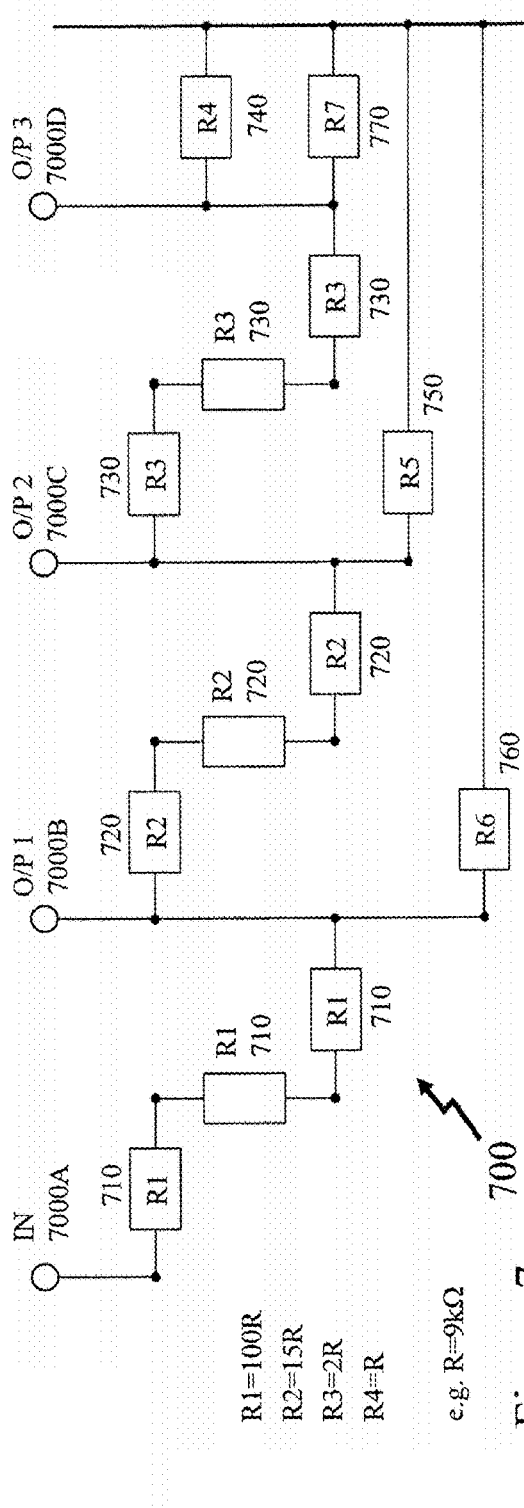
FIG. 7 depicts a multi-range voltage divider circuit according to an embodiment of the invention.

Referring to FIG. 7 there is depicted a MRVDC 700 according to an embodiment of the invention which is structurally similar to that of MRVDC 400 in FIG. 4 except that now in addition to O/P 1 7000B and O/P 2 7000C being coupled in parallel to ground with the subsequent divider circuits via resistors R5 750 and R6 750 then O/P 3 7000D is similarly coupled in parallel to ground in parallel to R4 740 by R7 770. However, in this embodiment of the MRVDC 700 may have values of R1=R6=100R, R2=R5=15R, R3=R7=2R and R4=740, wherein R=9 kΩ for example. With R=9 kΩ then the input resistance for the IN 7000A port is 3 MΩ.

Figure 8:
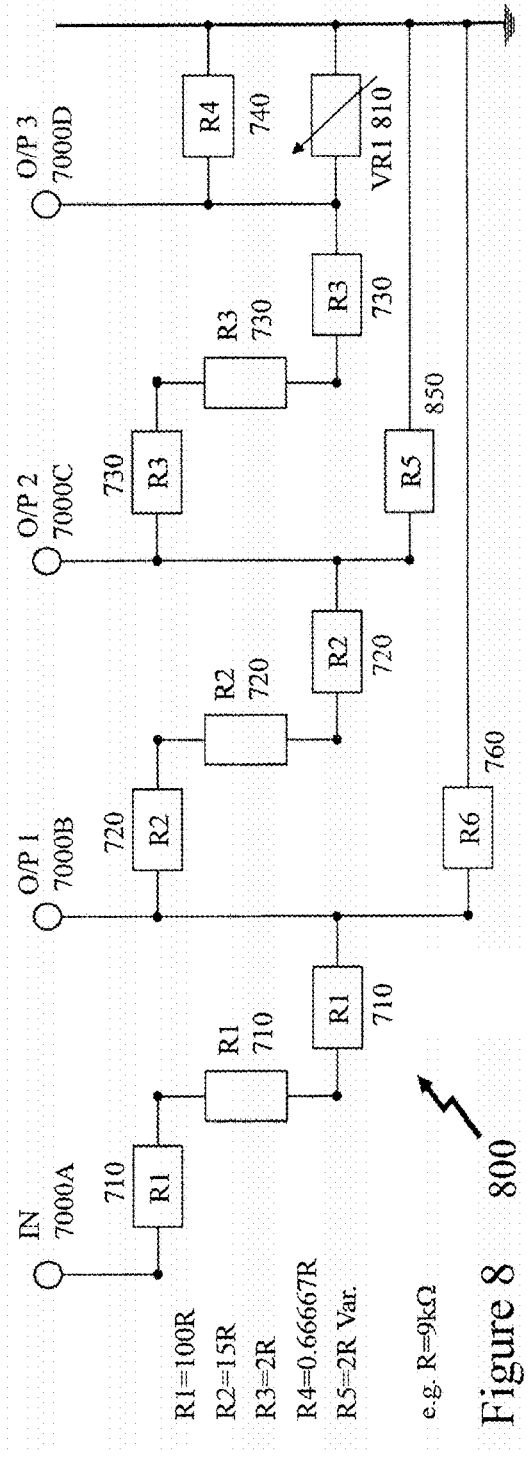
FIG. 8 depicts a multi-range voltage divider circuit according to an embodiment of the invention.

Now referring to FIG. 8 there is depicted an MRVDC 800 according to an embodiment of the invention wherein MRVDC 800 has the same construction as MRVDC 700 except that R7 770 has been replaced with variable resistor VR1 870. Accordingly, within an embodiment of the invention the values for MRVDC 800 may be R1=R6=100R, R2=R5=15R, R3=2R, R4=0.66667R, and VR1=2R where R=9 kΩ.

Figure 9:
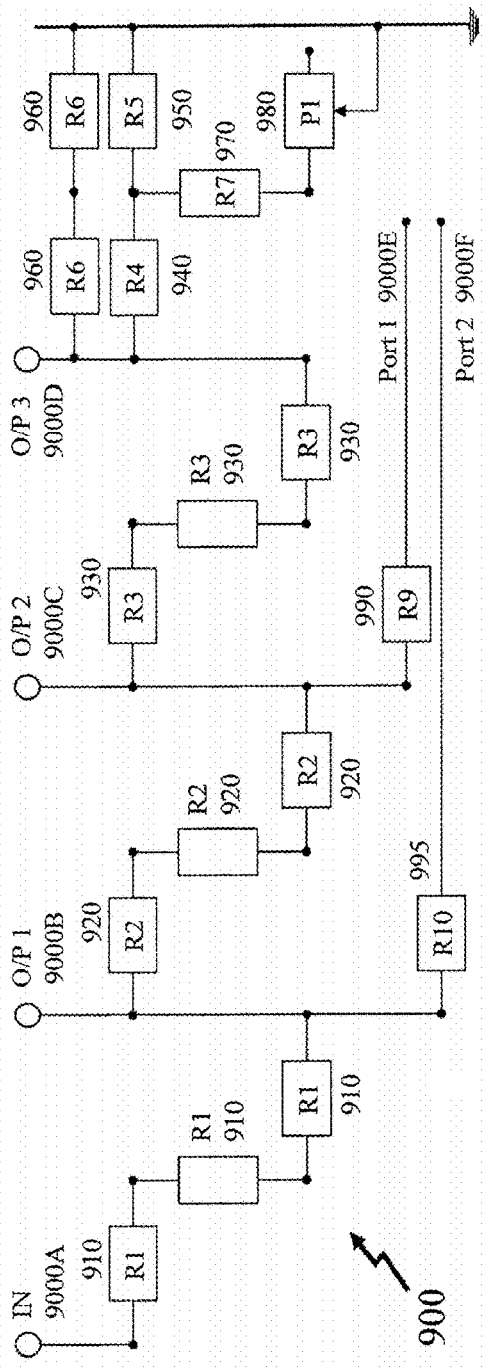
FIG. 9 depicts a multi-range voltage divider circuit according to an embodiment of the invention.

Now referring to FIG. 9 there is depicted a MRVDC 900 according to an embodiment of the invention which is a variant of MRVDC 400 wherein the final resistor R4 940 (equivalent to R 440 in FIG. 4A) is replaced with the equivalent of adjustment circuit 600 in FIG. 6 comprising R5 950, R6 960, R7 970 and potentiometer P1 980. In contrast, to R9 990 and R10 995 being connected to ground they are connected to Port 1 9000E and Port 2 9000F respectively. Accordingly, within an embodiment of the invention the values for MRVDC 900 may be R1=150R, R2=R5=22.5R, R3=3R, R4=6 kΩ, R5=175Ω, R6=100 kΩ, R9=22.5R, R6=121.42R, R7=40 kΩ and P1=20 kΩ where R=9 kΩ.

Figure 10:
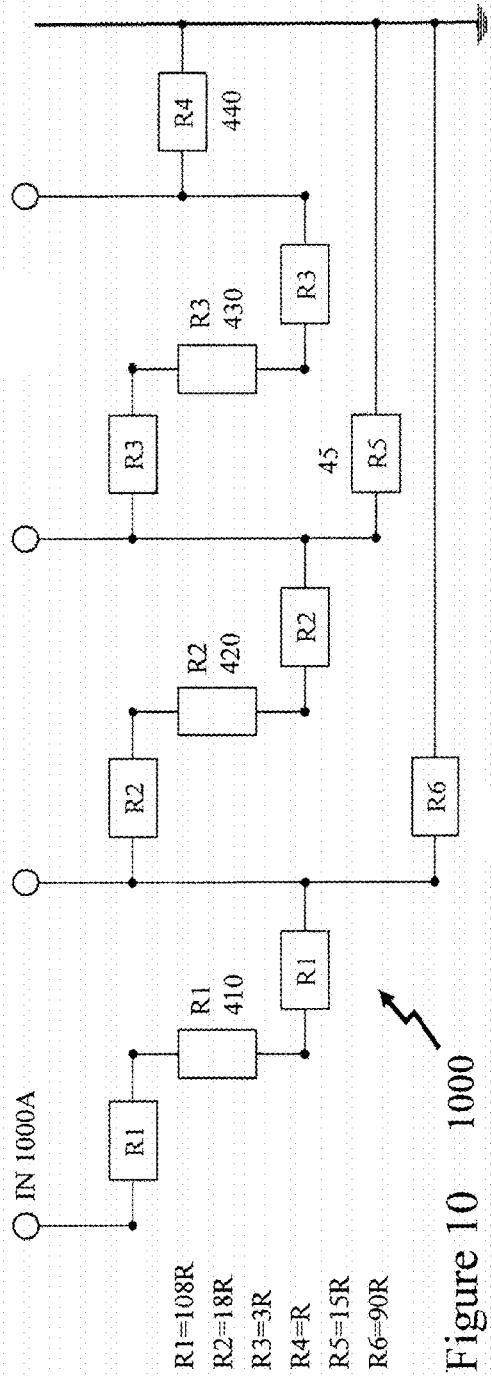
FIG. 10 depicts a multi-range voltage divider circuit according to an embodiment of the invention.

Referring to FIG. 10 there is depicted a MRVDC 1000 according to an embodiment of the invention which is a variant of MRVDC 400 in FIG. 4A wherein R1=108R, R2=18R, R3=3R, R4=R, R5=15R, and R6=90R where R=6 kΩ such that the input resistance of the IN port is 360R=2.160 MΩ.

Figure 11:
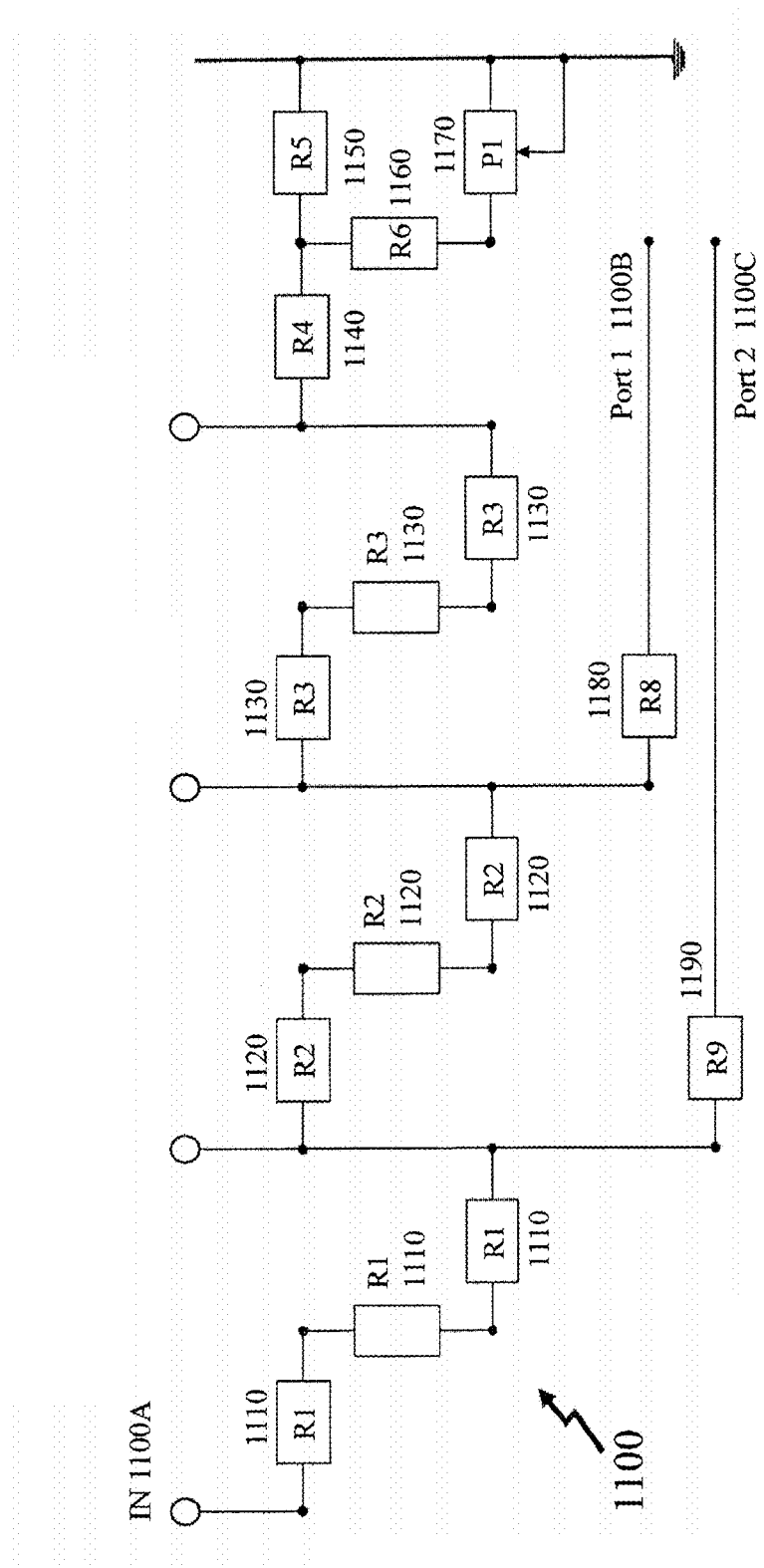
FIG. 11 depicts a multi-range voltage divider circuit according to an embodiment of the invention.

Now referring to FIG. 11 there is depicted a MRVDC 1100 according to an embodiment of the invention wherein MRVDC 400 in FIG. 4A wherein in contrast, to R5 450 and R6 460 being connected to ground R9 1190 and R8 1180 are connected to Port 1 1100A and Port 2 1100B respectively. Further, R4 is replaced with an adjustment variant circuit comprising R4 1140, R5 1150, R6 1160 and potentiometer P1 1170. Accordingly, within an embodiment of the invention the values for MRVDC 1100 may be R1=168.75R, R2=22.5R, R3=3R, R4=5.9 kΩ, R5=100Ω, R6=151 kΩ, R6=121.42R, R8=30R, R9=225R and P1=20 kΩ where R=9 kΩ.

Figure 12:
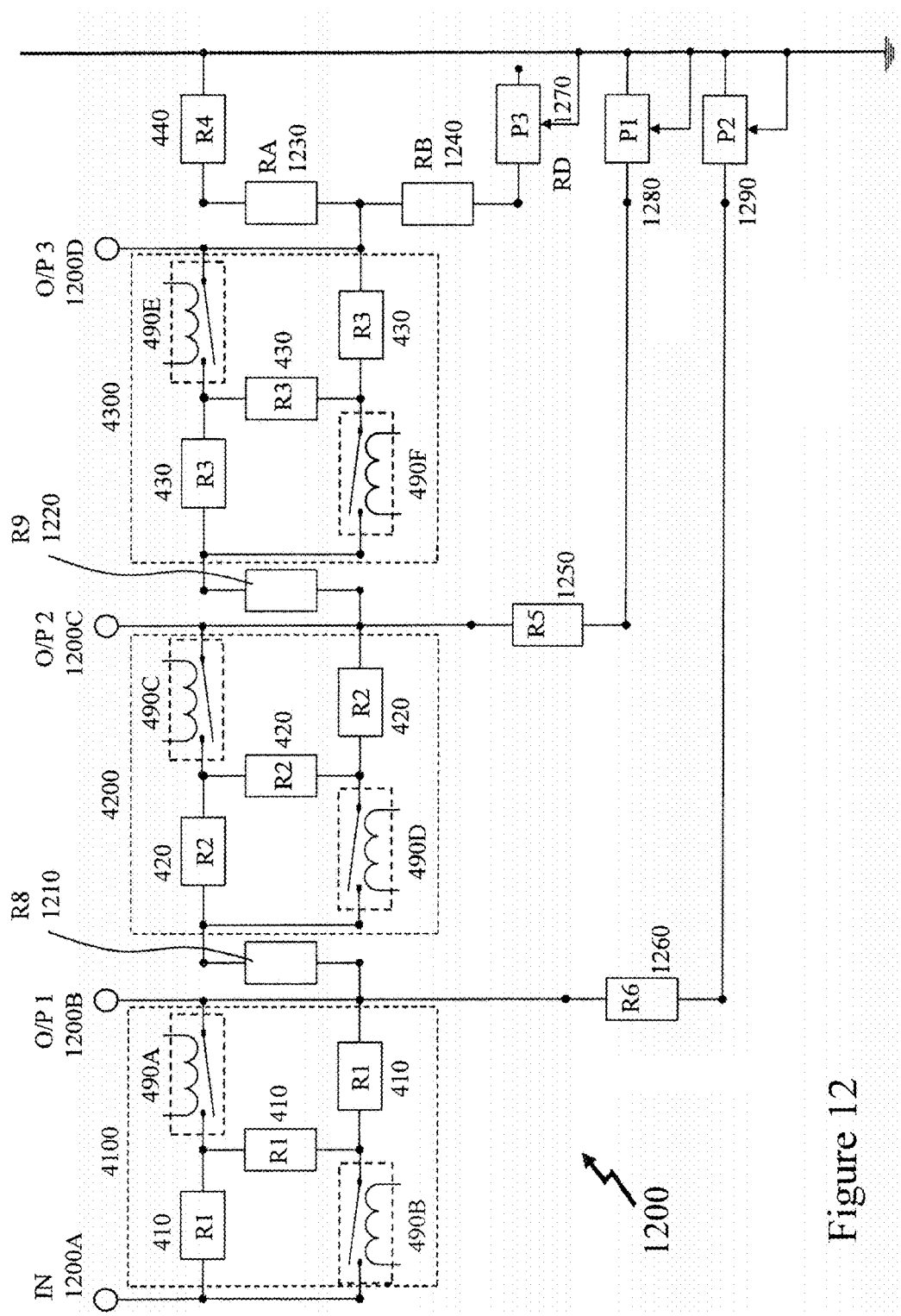
FIG. 12 depicts a multi-range voltage divider circuit with additional alignment components according to an embodiment of the invention.

Referring to FIG. 12 there is depicted a MRVDC 1200 with additional alignment components according to an embodiment of the invention. As depicted first, second, and third stages 4100, 4200, and 4300 of MRVDC 1200 are depicted such as depicted with respect to MRVDC 4000 in FIG. 4B. However, second and third stages 4200 and 4300 are now not directly coupled to O/P 1 1200B and O/P 2 1200C but coupled via first and second stage resistors R8 1210 and R9 1220 respectively. Further O/P 2 1200C is coupled to ground via third stage resistor R5 1250 and first potentiometer P1 1280 and O/P 1 1200B is coupled to ground via fourth stage resistor R6 1260 and second potentiometer P2 1290. The final stage now comprises fourth stage resistor R4 440 in series with first adjustment resistor RA1 1230 together with parallel ground path via second adjustment resistor 1240 and third potentiometer P3 1270. Within an embodiment of the invention R1=300R, R2=30R, R3=3R, R4=R, R5=R6=100 MΩ and RD1=100 kΩ.

Figure 13:
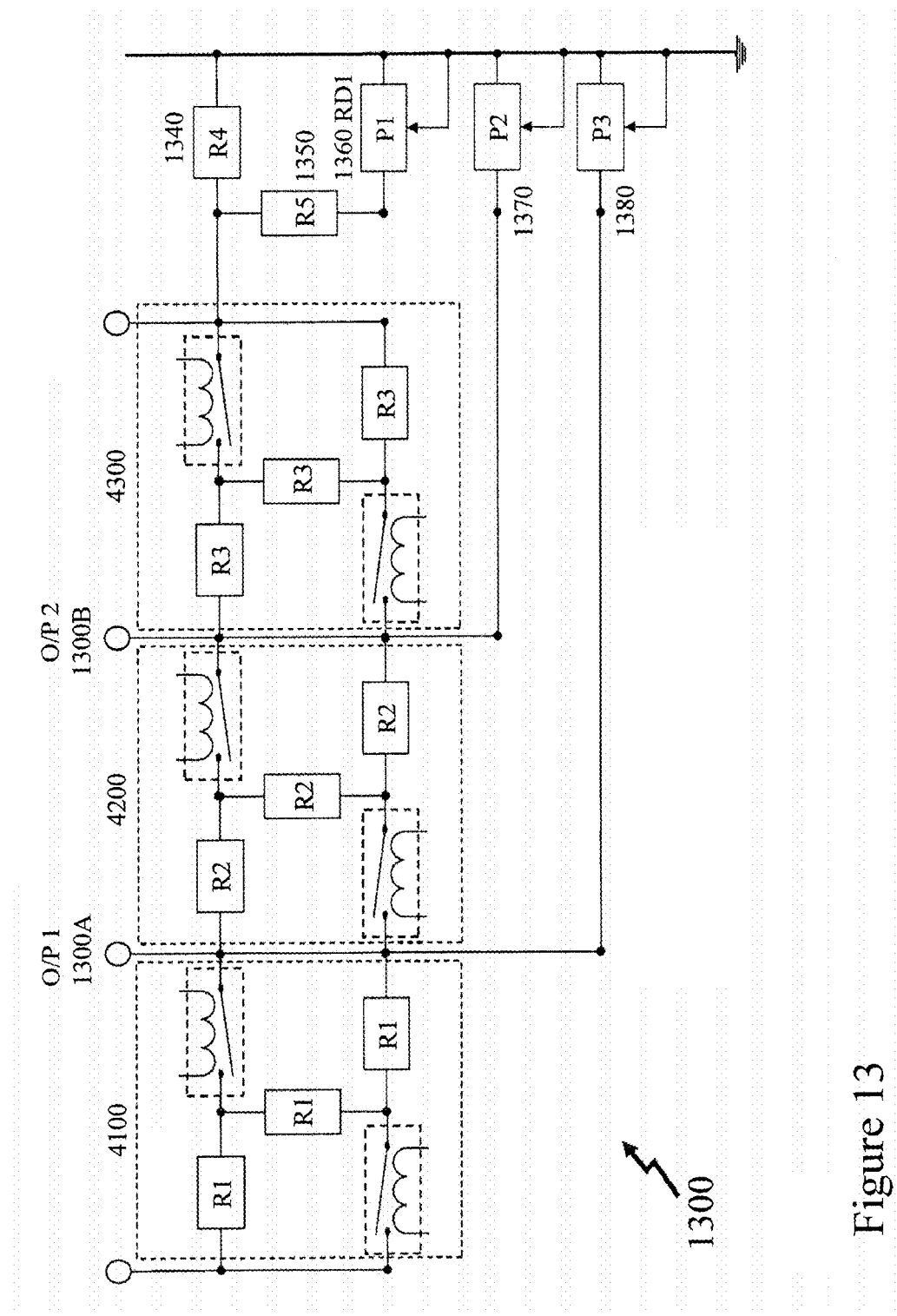
FIG. 13 depicts a voltage divider circuit with additional alignment components according to an embodiment of the invention.

Now referring to FIG. 13 there is depicted a MRVDC 1300 with additional alignment components according to an embodiment of the invention. MRVDC 1200 with additional alignment components according to an embodiment of the invention. As depicted first, second, and third stages 4100, 4200, and 4300 of MRVDC 1200 are depicted such as depicted with respect to MRVDC 4000 in FIG. 4B. Further, final resistor R4 1340 is now coupled to adjustment circuit comprising first resistor R5 1350 and first potentiometer P1 1360 (RD1). Each of the outputs O/P 1 1300A and O/P 2 1300B are coupled to ground via second and third potentiometers P2 1370 and P3 1380 respectively. Within an embodiment of the invention R1=300R, R2=20R, R3=3R, R4=1.5R, R5=3R and RD1 P1=100 kΩ.

Within the embodiments of the invention, such as MVRDC 1200 in FIG. 12 the auxiliary resistors RA 1230, RB 1240 and RD 1270 have different functions. RA 1230 shifts the value of R4 440 to compensate for RB 1240. RB 1240 scales the adjustment range of RD. Using an electronic potentiometer RD allows a digital balancing of the measurement bridge and add a calculated compensation (offset). The balanced bridge method produces an offset 10:1 ratio because of the relay ON resistance when balancing and OFF resistance when measuring. It would be evident that the RD value and adjustment range have to allow several factors including:

for bridge balancing for the lifetime stability of the main resistor chain of the multi-range voltage divider circuit;
addition of an ON correction (periodically measured);
addition of an OFF correction (as required for ratio calibration);
correct effects of the power resistance coefficient of the resistors.

Potentially, the ON and OFF corrections may be combined and determined only through the calibration process. When the relays are closed for calibration, the resulting resistance of the parallel combination is slightly higher, than the combination of the resistors alone. In other words, the balancing process underestimates values of the parallel connection of the three. This results in the ratio of the resulting divider being slightly above the 0.1 ratio, for example. When the relays are open (during tests), residual leakages affect the 3×3R resistive chains within each divider stage, decreasing the effective resistance of the series connection. This, again, results in the ratio of the divider being slightly higher, than the expected ratio. Both effects can be estimated and the results may be used to compensate the error by decreasing value of the bottom branch balancing rheostat by a calculated amount.

Figure 14:
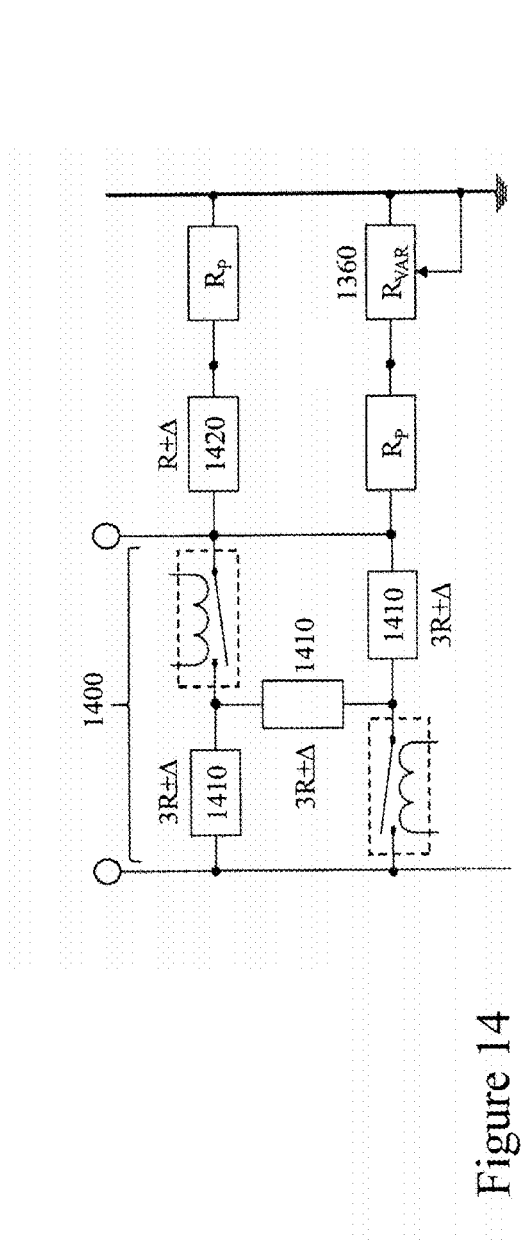
FIG. 14 depicts part of a multi-range voltage divider circuit with alignment components according to an embodiment of the invention for analysis of ageing and adjustment.
Figure 15:
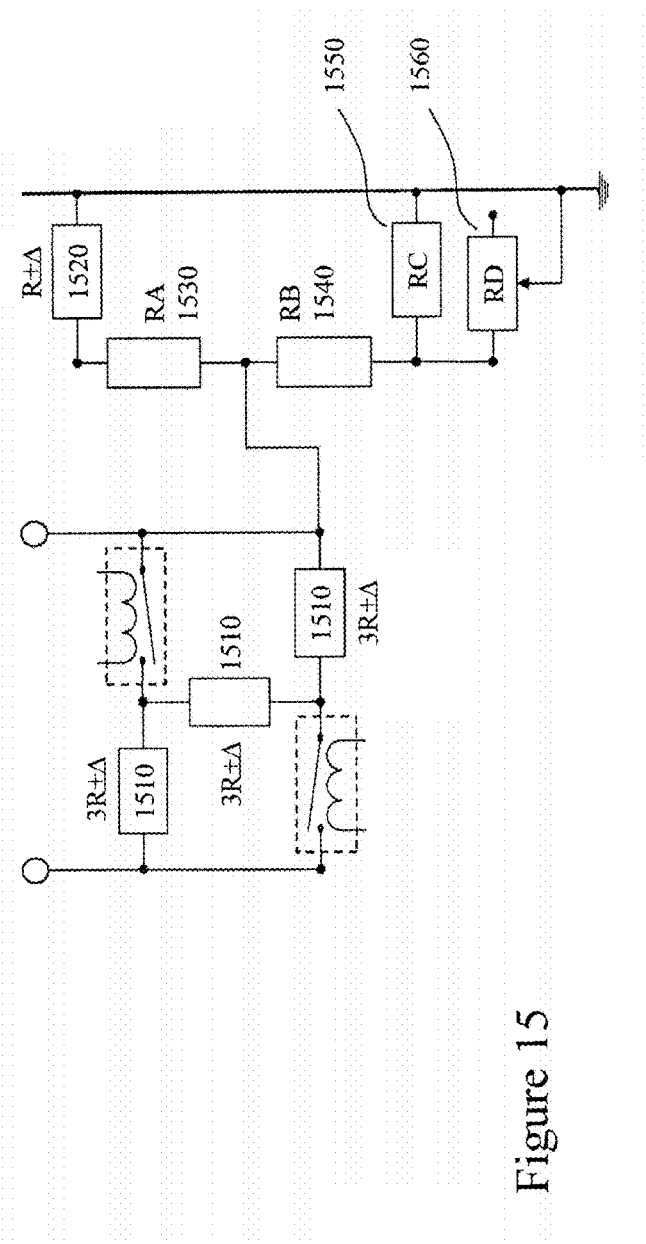
FIG. 15 depicts a voltage divider circuit with additional alignment components according to an embodiment of the invention to address aging variations within adjustment.

Amongst the factors to be compensated within the MRVDC designs is the effect of aging on the MRVDC and factoring into overall adjustment range. It is important that the aging etc. are established such that alignment can always be achieved. For example, referring to FIG. 14 there is depicted part of a MRVDC with alignment components according to an embodiment of the invention for analysis of ageing and adjustment. The stage 1400 comprises three first resistors 1410 with resistance 3R±Δ whilst second resistor 1420 has a value R±Δ. In order for an alignment to be achieved R≥3R∥3R∥3R. Accordingly, as depicted in FIG. 15 there is depicted an adjustment circuit wherein to achieve the desired performance first adjustment resistor RA 1530 is disposed in series with the second resistor 1520. Alternatively, setting the value of the second resistor 1520 to larger than 3R∥3R∥3R would eliminate the requirement for the second resistor RA 1530. Further, RB 1540 and RC 1550 should be the highest possible.

Specific details are given in the above description to provide a thorough understanding of the embodiments. However, it is understood that the embodiments may be practiced without these specific details. For example, circuits may be shown in block diagrams in order not to obscure the embodiments in unnecessary detail. In other instances, well-known circuits, processes, algorithms, structures, and techniques may be shown without unnecessary detail in order to avoid obscuring the embodiments.

Implementation of the techniques, blocks, steps and means described above may be done in various ways. For example, these techniques, blocks, steps and means may be implemented in hardware, software, or a combination thereof. For a hardware implementation, the processing units may be implemented within one or more application specific integrated circuits (ASICs), digital signal processors (DSPs), digital signal processing devices (DSPDs), programmable logic devices (PLDs), field programmable gate arrays (FPGAs), processors, controllers, micro-controllers, microprocessors, other electronic units designed to perform the functions described above and/or a combination thereof.

Also, it is noted that the embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be rearranged. A process is terminated when its operations are completed, but could have additional steps not included in the figure. A process may correspond to a method, a function, a procedure, a subroutine, a subprogram, etc. When a process corresponds to a function, its termination corresponds to a return of the function to the calling function or the main function.

The foregoing disclosure of the exemplary embodiments of the present invention has been presented for purposes of illustration and description. It is not intended to be exhaustive or to limit the invention to the precise forms disclosed. Many variations and modifications of the embodiments described herein will be apparent to one of ordinary skill in the art in light of the above disclosure. The scope of the invention is to be defined only by the claims appended hereto, and by their equivalents.

Further, in describing representative embodiments of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

What is claimed is:
1. A device comprising:
a microprocessor;
an input port;
an input selector coupled to the input port for coupling an electrical signal applied to the input port to a selected a voltage divider of a plurality of voltage dividers, each voltage divider of the plurality of voltage dividers being independent of any other voltage divider of the plurality of voltage dividers;
an output selector coupled to the plurality of voltage dividers for coupling the selected voltage divider of the plurality of voltage dividers to an output port;

a calibration bridge;
a null detector circuit;
a switching circuit disposed between the output selector and the plurality of voltage dividers selectively connecting the selected voltage divider of the plurality of voltage dividers to either the output selector or the calibration bridge;
wherein the calibration bridge is coupled to the switching circuit and a voltage reference source and provides first and second signals to the null detector circuit;
the device operates independent of whether the electrical signal is an AC electrical signal or a DC electrical signal;
in a first configuration the electrical signal at the input port is coupled to the output port via the selected voltage divider of the plurality of voltage dividers; and
in a second configuration the selected voltage divider of the plurality of voltage dividers is automatically calibrated by a calibration routine in execution upon the microprocessor and the selected voltage divider of the plurality of voltage dividers is coupled to the calibration bridge.

2. The device according to claim 1, wherein each voltage divider of the plurality of voltage dividers comprises a calibration adjustment circuit coupled to the voltage divider of the plurality of voltage dividers which is also coupled to the microprocessor; and
each voltage divider of the plurality of voltage dividers being independent of any other voltage divider of the plurality of voltage dividers.

3. The device according to claim 1, further comprising
an additional port on the output selector for coupling the voltage reference source to the output port.

4. The device according to claim 1, wherein in the second configuration the microprocessor stores first data relating to the calibration adjustments within a calibration matrix and second data relating to the plurality of voltage dividers within a voltage division matrix; and
the calibration matrix and voltage division matrix are stored within a non-transitory non-volatile memory forming part of the device.

5. The device according to claim 1, wherein the device further comprises a non-transitory non-volatile memory (memory); wherein
the memory stores:
a calibration matrix relating to calibration adjustments;
a voltage division matrix relating to the plurality of voltage division circuits; and
additional calibration characteristic information relating to at least one of temperature, DC versus AC performance, input current and pressure.

6. The device according to claim 1, wherein the device further comprises a non-transitory non-volatile memory storing a calibration matrix relating to calibration adjustments and a voltage division matrix relating to the plurality of voltage division circuits; and
the device exploits time dependent data within at least one of the calibration matrix and the voltage division matrix allowing a series of measurements to be performed with a test measurement system comprising the device before automatically performing a recalibration; wherein
a frequency of performing the recalibration is established in dependence upon an indication of a measurement accuracy provided to the microprocessor during a configuration of the device.

7. A device comprising:
a microprocessor;
an input port;
a plurality of slots, each slot for receiving a voltage divider circuit of a plurality of voltage divider circuits which is independent of any other voltage divider circuit of the plurality of voltage divider circuits;
an input selector coupled to the input port for selectively coupling an electrical signal received at the input port to a selected slot of the plurality of slots;
an output selector switch coupled to the plurality of slots for coupling a selected slot of the plurality of slots to an output port;
a switching circuit comprising:
a first portion disposed between the output selector and the plurality of slots for selectively connecting the selected slot to either the output selector or a calibration bridge; and
a second portion coupled to the plurality of slots for selectively coupling the selected slot to the calibration bridge;
the calibration bridge is coupled to the switching circuit and a voltage reference source and provides first and second signals to a null detector circuit; and
the null detector circuit;
wherein the device operates independent of whether the electrical signal is an AC electrical signal or a DC electrical signal;
in a first configuration the electrical signal at the input port is coupled to the output port via a selected voltage divider circuit of the plurality of voltage divider circuits installed within a slot of the plurality of slots; and
in a second configuration a selected voltage divider installed within the slot of the plurality of slots is automatically calibrated by a calibration routine in execution upon the microprocessor wherein a reference voltage generated by the installed and selected voltage divider circuit of the plurality of voltage divider circuits is coupled to the calibration bridge via the second portion of the switching circuit.

8. The device according to claim 7, wherein each voltage divider circuit of the plurality of voltage divider circuits for installation within a slot of the device comprises at least:
a port for receiving an electrical signal and coupling it to a voltage divider circuit;
the voltage divider for dividing the received electrical signal by a predetermined factor and coupling it to a first output port of the voltage divider;
a reference voltage source; and
a second output port coupled to the reference voltage sense.

9. The device according to claim 8, wherein the voltage divider circuit of the plurality of voltage dividers further comprises a protection circuit disposed prior to a voltage divider circuit of the plurality of voltage divider circuits.

10. The device according to claim 8, wherein each voltage divider circuit of the plurality of voltage divider circuits also comprises a calibration adjustment circuit which is coupled to the microprocessor via an interface when the voltage divider circuit of the plurality of voltage divider circuits is installed within a slot of the device.

11. The device according to claim 7, further comprising
an additional port on the output selector for coupling a voltage reference source from an installed voltage divider to the output port.

12. The device according to claim 7, wherein in the second configuration the microprocessor stores first data relating to the calibration adjustments within a calibration matrix and second data relating to the voltage divider circuits within a voltage division matrix; and the calibration matrix and voltage division matrix are stored within a non-transitory non-volatile memory forming part of the device.

13. The device according to claim 7, wherein the device further comprises a non-transitory non-volatile memory (memory); wherein the memory stores:

a calibration matrix relating to calibration adjustments;

a voltage division matrix relating to the plurality of voltage division circuits; and additional calibration characteristic information relating to at least one of temperature, DC versus AC performance, input current and pressure.

14. The device according to claim 7, wherein the device further comprises a non-transitory non-volatile memory storing a calibration matrix relating to calibration adjustments and a voltage division matrix relating to the plurality of voltage division circuits; and the device exploits time dependent data within at least one of the calibration matrix and the voltage division matrix allowing a series of measurements to be performed with a test measurement system comprising the device before automatically performing a recalibration; wherein a frequency of performing the recalibration is established in dependence upon an indication of a measurement accuracy provided to the microprocessor during a configuration of the device.

15. A device comprising:

a port for receiving an electrical signal from a connector coupled to the port and coupling it to a voltage divider circuit;

the voltage divider circuit for dividing the received electrical signal and coupling it to a first output port of the voltage divider;

a reference voltage source;

a calibration adjustment circuit which is coupled to an external microprocessor via an interface when the voltage divider is installed into a slot of a chassis; and a second output port coupled to the reference voltage source;

wherein the device is configured for insertion into the slot of a plurality of slots of the chassis, the chassis comprising:

a microprocessor;

an input port;

a plurality of slots, each slot for receiving a device;

an input selector coupled to the input port for selectively coupling an electrical signal received at the input port to a selected slot of the plurality of slots;

an output selector switch coupled to the plurality of slots for coupling a selected slot of the plurality of slots to an output port;

a switching circuit comprising:

a first portion disposed between the output selector and the plurality of slots for selectively coupling the selected slot to the output selector or a calibration bridge; and a second portion coupled to the plurality of slots for selectively coupling the selected slot to the calibration bridge;

the calibration bridge for providing first and second signals to a null detector circuit; and the null detector circuit;

wherein each voltage divider circuit within each device inserted into a slot of the plurality of slots operates independent of any other voltage divider circuit in any other device installed in the plurality of slots within the chassis;

in a first configuration an electrical signal at the input port is coupled to the output port via a selected voltage divider installed within a slot of the plurality of slots;

in a second configuration a selected voltage divider installed within the slot of the plurality of slots is automatically calibrated by a calibration routine in execution upon the microprocessor wherein a reference voltage generated by the installed voltage divider is coupled to the calibration bridge via the second portion of the switching circuit; and the chassis with one or more devices inserted into a slot of the plurality of slots operates independent of whether the electrical signal is an AC electrical signal or a DC electrical signal.

16. The device according to claim 15, further comprising an additional port on the output selector for coupling a voltage reference source from an installed voltage divider to the output port.

17. The device according to claim 15, further comprising a protection circuit disposed prior to a voltage divider circuit.

18. The device according to claim 15, wherein the chassis further comprises a non-transitory non-volatile memory (memory); and in the second configuration the microprocessor stores first data relating to the calibration adjustments within a calibration matrix in the memory and second data relating to the voltage divider circuits within a voltage division matrix in the memory.

19. The device according to claim 15, wherein the chassis further comprises a non-transitory non-volatile memory (memory);

wherein the memory stores:

a calibration matrix relating to calibration adjustments for the plurality of voltage division circuits;

a voltage division matrix relating to the plurality of voltage division circuits; and additional calibration characteristic information relating to at least one temperature, DC versus AC performance, input current and pressure.

* * * * *